United States Patent [19]
Fujii et al.

[11] Patent Number: 5,202,579
[45] Date of Patent: Apr. 13, 1993

[54] SEMICONDUCTOR DEVICE HAVING MULTILAYER INTERCONNECTION STRUCTURE

[75] Inventors: Hiroyuki Fujii; Shigeru Harada, both of Hyogo, Japan

[73] Assignee: Mitsubishi Denki Kabushiki Kaisha, Tokyo, Japan

[21] Appl. No.: 822,284

[22] Filed: Jan. 21, 1992

[30] Foreign Application Priority Data

Jan. 30, 1991 [JP] Japan .................................. 3-9547

[51] Int. Cl.$^5$ .................. H01L 23/485; H01L 29/460; H01L 29/540
[52] U.S. Cl. ................................ 257/751; 257/758; 257/763; 257/915
[58] Field of Search ............................ 357/65, 71, 67; 437/192

[56] References Cited

U.S. PATENT DOCUMENTS

| | | | |
|---|---|---|---|
| 4,884,123 | 11/1989 | Dixit et al. | 357/71 |
| 4,924,295 | 5/1990 | Kücher | 357/71 |
| 4,926,237 | 5/1990 | Sun et al. | 357/71 |
| 5,008,730 | 4/1991 | Huang et al. | 357/71 |

FOREIGN PATENT DOCUMENTS

| | | | |
|---|---|---|---|
| 0370775 | 5/1990 | European Pat. Off. | 437/192 |
| 0066955 | 3/1989 | Japan | 357/71 |
| 0054524 | 2/1990 | Japan | 437/192 |

OTHER PUBLICATIONS

Abe et al., "High Performance Multilevel Interconnection System with Stacked Interlayer Dielectrics by Plasma CVD and Bias Sputtering", IEEE 1989 VMIC Conference, Jun. 12-13, 1989, pp. 404-410.

Nishida et al., "Multilevel Interconnection for Half-Micron ULSI's", IEEE 1989 VMIC Conference, Jun. 12-13, 1989, pp. 19-25.

Fritsch et al., "A Submicron CMOS Two Level Metal Process with Planarization Techniques", IEEE 1988 VMIC Conference, Jun. 13-14, 1988, pp. 69-75.

*Primary Examiner*—Rolf Hille
*Assistant Examiner*—Peter Toby Brown
*Attorney, Agent, or Firm*—Lowe, Price, LeBlanc & Becker

[57] ABSTRACT

A semiconductor device having a multilayer interconnection structure includes a tungsten plug buried in a contact hole formed in an interlayer insulating film covering first aluminum interconnection with a first titanium film and a first titanium nitride film interposed therebetween, and second aluminum interconnection formed thereon with a second titanium film and a second titanium nitride film interposed therebetween. According to this structure, remaining particles of an alterated layer of aluminum formed on the surface of the first aluminum interconnection are removed, and the first aluminum interconnection reacts with the first titanium film to form an intermetallic compound, so that mixing of the interface between them is carried out. Coverage of the contact hole is improved by burying the tungsten plug.

5 Claims, 14 Drawing Sheets

SEMICONDUCTOR DEVICE HAVING MULTILAYER INTERCONNECTION STRUCTURE

BACKGROUND OF THE INVENTION

1. Field of the Invention

The present invention relates to a semiconductor device having a multilayer interconnection structure and a method of manufacturing the same, and, more particularly, to a technique for stabilizing the contact resistance in a contact hole of a lower layer of aluminum interconnection and an upper layer of aluminum interconnection and for enhancing the reliability in the contact hole. Description of the Background Art Various types of interconnection is normally necessary in a semiconductor device for electrically connecting elements with each other and connecting the elements with external circuits after forming the elements on a semiconductor substrate.

Conventionally, a polycrystalline silicon film, a refractory metal film, a refractory metal silicide film, an aluminum film, or an aluminum alloy film has been used as interconnection.

It is necessary to lower the wiring resistance in recent high-speed and highly-integrated devices, and a multilayer interconnection structure formed of aluminum films or aluminum alloy films having small resistivity is necessary.

FIG. 1 is a cross sectional view illustrating a structure of a DRAM (Dynamic Random Access Memory) device as an example of such a conventional semiconductor device having an aluminum multilayer interconnection structure.

Referring to FIG. 1, a conventional semiconductor device includes a DRAM element (stacked cell) 2 formed on the surface of a silicon semiconductor substrate 1 and an insulating film 3 deposited on DRAM element 2. First aluminum interconnection 4 is formed on insulating film 3, and an interlayer insulating film 5 is deposited on first aluminum interconnection 4. Second aluminum interconnection 7 is formed on interlayer insulating film 5, and a contact hole 6 is provided in interlayer insulating film 5 for connecting first aluminum interconnection 4 and second aluminum interconnection 7. A protective insulating film 8 is deposited on the semiconductor element and interconnection for protecting them from moisture and the like invading from the outside.

In a conventional semiconductor device having an aluminum multilayer interconnection structure as illustrated in FIG. 1, the stability of contact hole 6 which is a connection part of first layer of aluminum interconnection 4 and second layer of aluminum interconnection 7 is an important technical point which influences the yield or the reliability level of the device.

General description will be given of a manufacturing flow of the conventional semiconductor device illustrated in FIG. 1, mainly of the part of the step of forming contact hole 6, with reference to FIGS. 2A to 2G.

Although a combination of polycrystalline silicon interconnection, refractory metal interconnection, refractory metal silicide interconnection, and aluminum interconnection is generally used as a multilayer interconnection structure as described above, a case of an aluminum two-layer interconnection structure in which first layer of interconnection 4 and second layer of interconnection 7 are both of aluminum interconnection will be described for simplicity of description.

First, a DRAM element (stacked cell) 2 including an element isolating oxide film 301, a transfer gate electrode 302, an impurity diffused layer 303, a word line 304, a storage node 305, a capacitor insulating film 306, and a cell plate 307 is formed on the surface of a silicon semiconductor substrate 1 (FIG. 2A).

Then, a first insulating film 3 is deposited over the whole surface of silicon semiconductor substrate 1 having DRAM element (stacked cell) 2 formed thereon, and then a contact hole 308 is opened in a desired part using a photolithography process or an etching process. Then, a first layer of aluminum interconnection 4 is formed as described in the following.

In recent submicron devices, interconnection having a structure of a combination of a barrier metal film 310 formed of titanium nitride (TiN), titanium tungsten (TiW) or the like as first layer of aluminum interconnection 4 and an aluminum alloy film 311 formed of Al-Si, Al-Si-Cu or the like is used. This is because it prevents junction leakage caused by abnormal reaction (alloy spike) of first layer of aluminum interconnection 4 and the impurity diffused layer of silicon semiconductor substrate 1 in contact hole 308, and it also prevents contact failure generated by silicon in first layer of aluminum interconnection 4 being deposited in contact hole 308 by solid phase epitaxial growth, and it also enhances resistance to "stress migration" in which interconnection is disconnected by the membrane stress of interlayer insulating film 5 or protective insulating film 8 formed above first layer of aluminum interconnection 4. The films are normally deposited by a sputtering process. Thus deposited films are patterned to be first layer of aluminum interconnection 4 using a photolithography process or an etching process. "Aluminum interconnection" here also indicates one having such a multilayer structure (FIG. 2B).

Then, an interlayer insulating film 5 is deposited over the whole surface of first layer of aluminum interconnection 4. An insulating film formed of a combination of a silicon oxide film 321 deposited by a chemical vapor deposition process (CVD), an inorganic application insulating film 322, and a silicon oxide film 323 deposited by a CVD process is used, for example, as interlayer insulating film 5 (FIG. 2C).

Silicon oxide film 321 is generally deposited by a CVD process utilizing heat or plasma at a deposition temperature in the range of 300° C.-450° C. using silane (SiH$_4$) gas, oxygen (O$_2$) gas, or nitrous oxide (N$_2$O) gas. Recently, an organic silane contained material such as TEOS (Tetra-Ethyl-Ortho-Silicate) characterized by satisfactory step coverage is also used.

A material including silanol (Si(OH)$_4$) or the like as a main component is generally used as the material of inorganic application insulating film 322 used for flattening. It is applied in a rotative manner, then baked at a temperature in the range of 400° C.-450° C., and made into a silicon oxide film to flatten the surface of silicon oxide film 321 formed by a CVD process.

However, inorganic application insulating film 322 has high hydroscopicity and has harmful effects such as outgassing when it is exposed in a contact hole 6 which will be described later or its sidewall, so that it is etched back by a dry etching process using a fluorine contained gas or Ar gas so as not to be exposed in contact hole 6 or its sidewall.

A silicon oxide film 323 is deposited thereon by the same method as the one used for forming silicon oxide film 321.

A part of interlayer insulating film 5 where electrical connection with first layer of aluminum interconnection 4 is to be made is removed by a photolithography process and an etching process to open a contact hole 6 (FIG. 2D).

Specifically, the region except for the part 6 where a contact hole is to be opened is covered with a photoresist 324 by a photolithography process, and then interlayer insulating film 5 is selectively removed by a taper etching process in which wet etching using a hydrofluoric acid contained solution and a reactive ion etching process using $CHF_3$, $O_2$ and the like as a main component gas are combined, for example, to open a contact hole 6.

Photoresist 324, reaction products generated during etching and the like are removed after etching by using oxygen ($O_2$) plasma or wet chemical processing.

The outermost surface of first layer of aluminum interconnection 4 in contact hole 6 is exposed to plasma of a fluorine contained gas such as $CHF_3$ or oxygen gas during the step of forming contact hole 6, so that an altered layer of aluminum (a layer formed of fluoride or oxide and having insulating properties) 201 having a thickness of approximately 100Å is formed on the outermost surface of first layer of aluminum interconnection 4 in contact hole 6. In order to remove it and obtain stable contact resistance, sputter etching using Ar ions 202 is carried out first, before depositing a second layer of aluminum interconnection 7 which will be described later (FIG. 2E).

Then, a second layer of aluminum interconnection 7 is formed successively in a vacuum. An aluminum alloy film such as Al-Si, Al-Si-Cu, Al-Cu or the like is used as the material of second layer of aluminum interconnection 7. The films are deposited by a sputtering process and patterned to be interconnected by a photolithography process or an etching process as in the case of first layer of aluminum interconnection 4 (FIG. 2F).

After forming second layer of aluminum interconnection 7, heat treatment is carried out at a temperature in the range of about 400° C. to about 450° C. for making satisfactory electrical connection between first layer of aluminum interconnection 4 and second layer of aluminum interconnection 7 in contact hole 6.

Finally, a protective insulating film 8 formed of a silicon oxide film, a silicon nitride film or the like is deposited on second layer of aluminum interconnection 7 by a CVD process for protecting the semiconductor element and interconnection from moisture or the like invading from the outside (FIG. 2G).

Since the conventional aluminum multilayer interconnection structure is formed as described above, there is a problem of deterioration in the stability and reliability of the electrical connection between first layer of aluminum interconnection 4 and second layer of aluminum interconnection 7 in contact hole 6 of a submicron level because of reduction in its diameter according to miniaturization of the interconnection.

As described above, conventionally, sputter etching using Ar ions is carried out before depositing second layer of aluminum interconnection 7. It is carried out for removing altered layer of aluminum (fluoride or oxide) 201 formed on the surface of first layer of aluminum interconnection 4 in contact hole 6 by using Ar ions 202, as illustrated in FIG. 2E.

In the case of the conventional device structure in which the aspect ratio B/A (A expresses the diameter of contact hole 6, and B expresses the thickness of interlayer insulating film 5) of contact hole 6 is relatively small and is 1 μm or less, particles 203 of fluoride or oxide of aluminum sputtered by Ar ions 202 are drifted sufficiently outside contact hole 6 as illustrated in FIG. 3A, so that it is possible to remove altered layer 201 of aluminum and to clean the surface.

However, in the case of contact hole 6 of a submicron level in which the aspect ratio exceeds 1, a part of particles 203 of fluoride or oxide of aluminum sputtered by Ar ions 202 are obstructed by the sidewall of contact hole 6 and cannot be drifted outside contact hole 6, and it re-attaches inside contact hole 6 to leave remaining particles 204 of fluoride or oxide as illustrated in FIG. 3B.

Therefore, even in a case where second layer of aluminum interconnection 7 is deposited successively in a vacuum, there are remaining particles 204 at the interface 205 between first layer of aluminum interconnection 4 and second layer of aluminum interconnection 7 in contact hole 6 where electrical connection is to be made as illustrated in FIG. 3C. Accordingly, mixing of first layer of aluminum interconnection 4 and second layer of aluminum interconnection 7 at interface 205 is not carried out sufficiently by heat treatment at a temperature in the range of about 400° C. to about 450° C. after formation of second layer of aluminum interconnection 7 as described in the above manufacturing flow.

As a result, increase in the contact resistance (hereinafter referred to as the contact hole resistance) or open failure of contact hole 6 is caused.

Even in a case where the initial value of the contact hole resistance is made normal by the above-described heat treatment at a temperature in the range of 400° C.–450° C., mixing at interface 205 is not carried out sufficiently, so that there is a problem of deterioration in the reliability of contact hole 6 such as resistance to electromigration or resistance to stress migration.

Another problem caused by increase in the aspect ratio of contact hole 6 is conspicuous deterioration in the coverage ratio of second layer of aluminum interconnection 7 formed by a sputtering process in contact hole 6. When coverage of aluminum in contact hole 6 is not good, the reliability in the part of contact hole 6 such as resistance to electromigration is deteriorated, and also the contact hole resistance is increased.

These problems will be more serious in the case of contact holes in submicron devices and half-micron devices in the future in which the aspect ratio becoms larger and larger.

SUMMARY OF THE INVENTION

An object of the present invention is to obtain a semiconductor device having a multilayer interconnection structure of a high quality with a high yield and a method of manufacturing the same by accelerating mixing at the interface between a lower layer of aluminum interconnection and an upper layer of aluminum interconnection in a contact hole which is a connection part between the lower layer of aluminum interconnection and the upper layer of aluminum interconnection to obtain stable contact resistance without defects or the like caused by foreign materials attached during formation of films and enhancing resistance to electromigration, resistance to stress migration and the like in the contact hole.

In a semiconductor device having a multilayer interconnection structure according to the present invention which achieves the above object, a contact hole whose bottom surface is the surface of first aluminum interconnection is provided in a predetermined position in an interlayer insulating film covering the first aluminum interconnection. A first titanium film is formed on the surface of the interlayer insulating film and on the inner surface of the contact hole, and a first titanium compound film is formed on the first titanium film. A tungsten plug is buried inside the contact hole with the first titanium film and the first titanium compound film interposed therebetween. A second titanium film is formed on the tungsten plug and on the first titanium compound film, and a second titanium compound film is formed on the second titanium film. Second aluminum interconnection is formed on the second titanium compound film.

According to the structure of this semiconductor device, since a titanium film has strong bonding strength for bonding with fluorine or oxygen, even if particles of fluoride or oxide of aluminum, which are re-attached during sputter etching or the like carried out on the surface of the first aluminum interconnection, remain, the first titanium film takes in the remaining particles as fluoride or oxide of titanium and decomposes them. In addition, the first titanium film reacts with the first aluminum interconnection to form $TiAl_3$, which is an intermetallic compound, at the interface, so that mixing at the interface is carried out sufficiently.

The first titanium compound film prevents the first titanium film, which is in contact with the first aluminum interconnection, from reacting with the tungsten plug earlier and functions to make the first titanium film react with the first aluminum interconnection by priority.

The tungsten plug is buried in the contact hole, so that coverage of the contact hole is improved.

The second titanium film is provided, so that fluorine, which might be generated during formation of the tungsten plug, is taken in as fluoride or oxide of titanium and decomposed. The second titanium compound film is provided, so that the second aluminum interconnection and a second titanium film formed thereon are prevented from reacting with each other.

According to a preferred embodiment of a semiconductor device having a multilayer interconnection structure of the present invention, the first titanium compound film and the second titanium compound film include titanium nitride.

It is preferable that each of the first titanium film and the second titanium film has a thickness in the range of 50Å–150Å.

It is preferable that each of the first titanium compound film and the second titanium compound film has a thickness in the range of 500Å–1000Å. The upper limit and the lower limit of the preferable thickness is determined to satisfy the condition that it is sufficient to inhibit the first titanium film from reacting with the tungsten plug and makes increase in the contact resistance so small as not to be a problem or the condition that it is sufficient to inhibit the second titanium film from reacting with the second aluminum interconnection and makes increase in the contact resistance so small as not to be a problem.

According to a method of manufacturing a semiconductor device having a multilayer interconnection structure of the present invention which achieves the above object, an insulating film is deposited on first aluminum interconnection to form an interlayer insulating film, and a contact hole whose bottom surface is the surface of the first aluminum interconnection is opened in a predetermined position in the interlayer insulating film. Then, a first titanium film is formed on the surface of the interlayer insulating film and on the inner surface of the contact hole, and a first titanium compound film is formed thereon. Then, tungsten is buried in the contact hole with the first titanium film and the first titanium compound film interposed therebetween to form a tungsten plug. Then, a second titanium film is formed on the tungsten plug and on the first titanium nitride film, and a second titanium nitride film is formed thereon. Second aluminum interconnection is formed on the second titanium nitride film.

According to a preferred embodiment of a method of manufacturing a semiconductor device having a multilayer interconnection structure of the present invention, after opening a contact hole, sputter etching using argon ions is carried out. It is carried out for obtaining stable contact resistance by removing an altered layer of aluminum generated on the bottom surface of the contact hole.

Sputtering is used for forming the first titanium film and the second titanium film, and a reactive sputtering process carried out in an atmosphere of argon and nitrogen using a titanium target is used for forming the first titanium compound film or the second titanium compound film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A structure of a semiconductor device according to an embodiment of the present invention will be described in the following with reference to FIG. 4.

Figure 4:
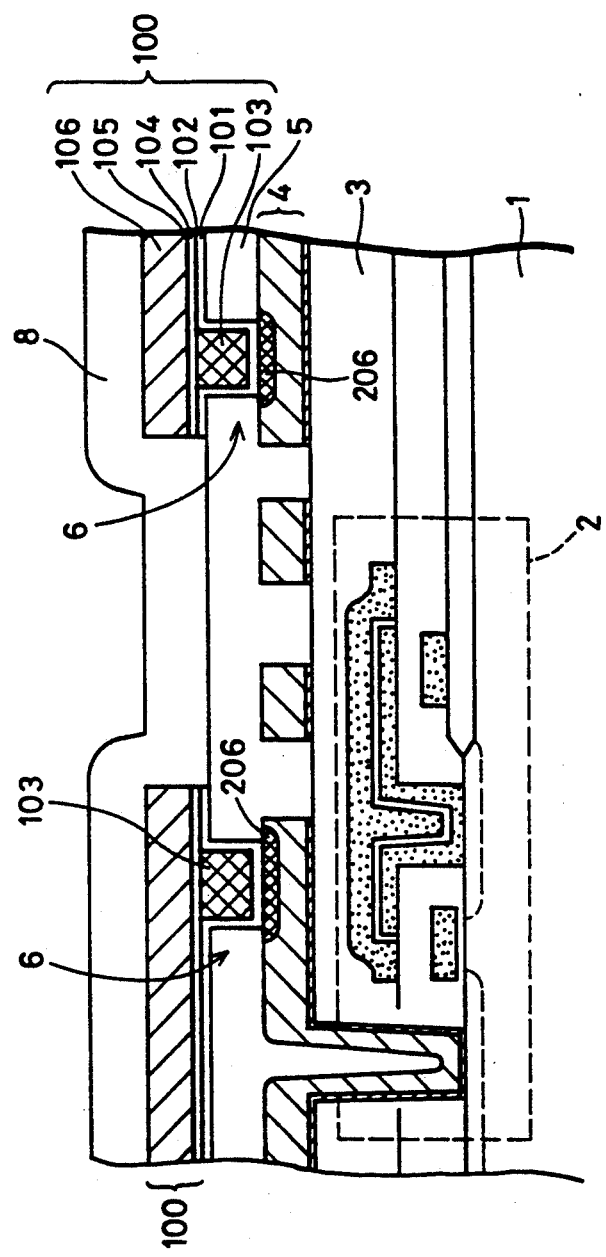
FIG. 4 is across sectional view illustrating a structure of a semiconductor device having a multilayer interconnection structure according to an embodiment of the present invention.

Referring to FIG. 4, a semiconductor device according to the present invention includes a DRAM element (stacked cell) 2 formed on the surface of a silicon semiconductor substrate 1 and an insulating film 3 deposited on DRAM element 2. First aluminum interconnection 4 is formed on insulating film 3, and an interlayer insulating film 5 is deposited on first aluminum interconnection 4. A contact hole 6 is opened in interlayer insulating film 5 on first aluminum interconnection 4. A first titanium film 101 is formed on the inner surface of contact hole 6 and on interlayer insulating film 5 in the vicinity of it, and a first titanium nitride film 102 is deposited on first titanium film 101. A tungsten plug 103 filling in contact hole 6 is deposited on first titanium nitride film 102, and a second titanium film 104 is deposited on first titanium nitride film 102 and on buried tungsten plug 103. A second titanium nitride film 105 is deposited on second titanium film 104, and second aluminum interconnection 106 formed of an aluminum alloy film is formed on second titanium nitride film 105. A protective insulating film 8 is deposited for protecting second aluminum interconnection 106 and exposed interlayer insulating film 5 from external environment. An intermetallic compound (TiAl$_3$) layer 206 is formed at the interface between first titanium film 101 and first aluminum interconnection 4 by reaction.

Now, a method of forming from first layer of titanium film 101 through second aluminum interconnection 106 in the semiconductor device illustrated in FIG. 4 will be described with reference to FIGS. 5A to 5J.

Figure 1:
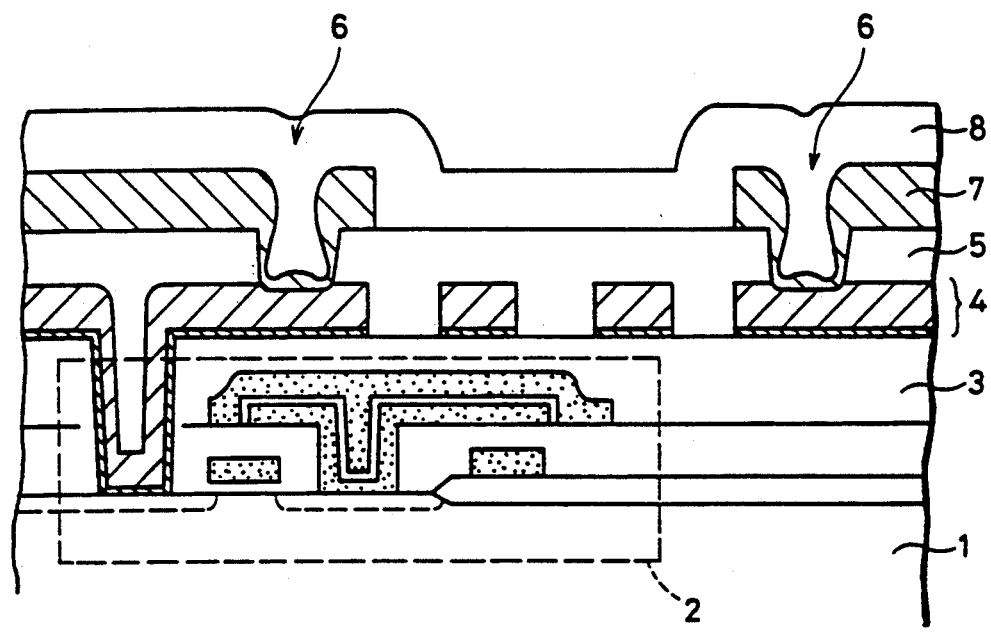
FIG. 1 is a cross sectional view illustrating a structure of a conventional semiconductor device having a multilayer interconnection structure.
Figure 2A:
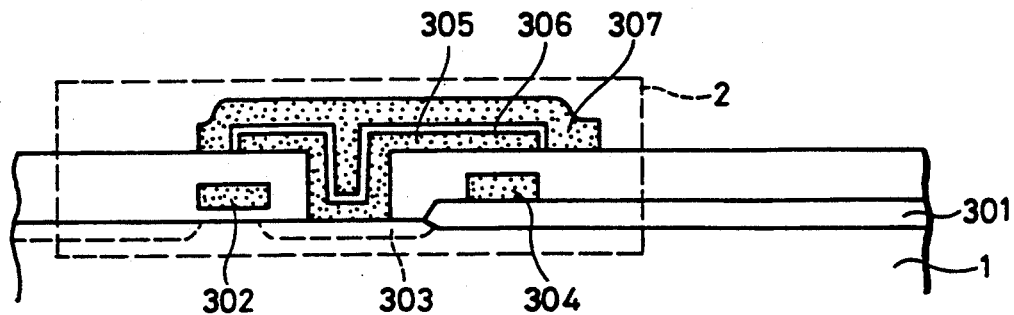
FIGS. 2A 2B, 2C, 2D, 2E ,2F, and 2G are cross sectional views illustrating, sequentially, a manufacturing process of the/conventional semiconductor device having a multilayer interconnection structure illustrated in FIG. 1.
Figure 2B:
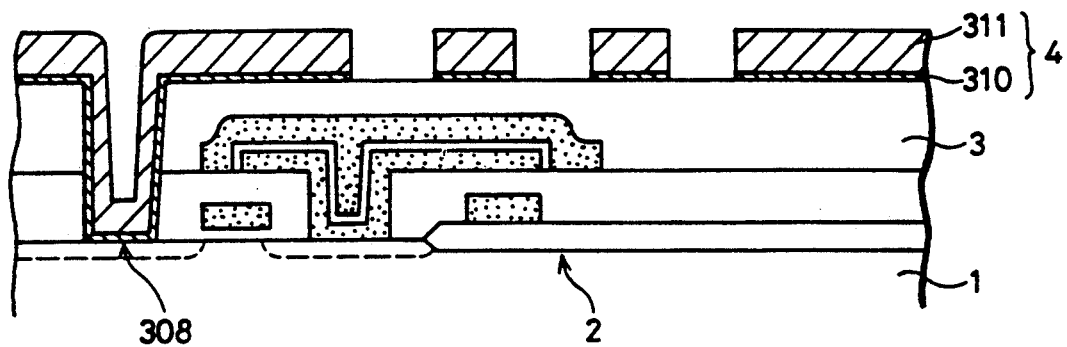
Figure 2C:
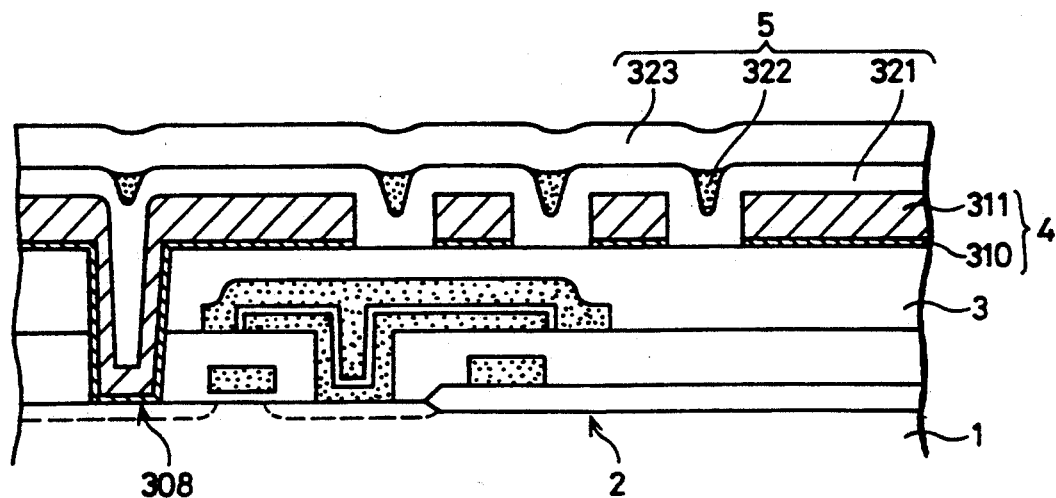
Figure 2D:
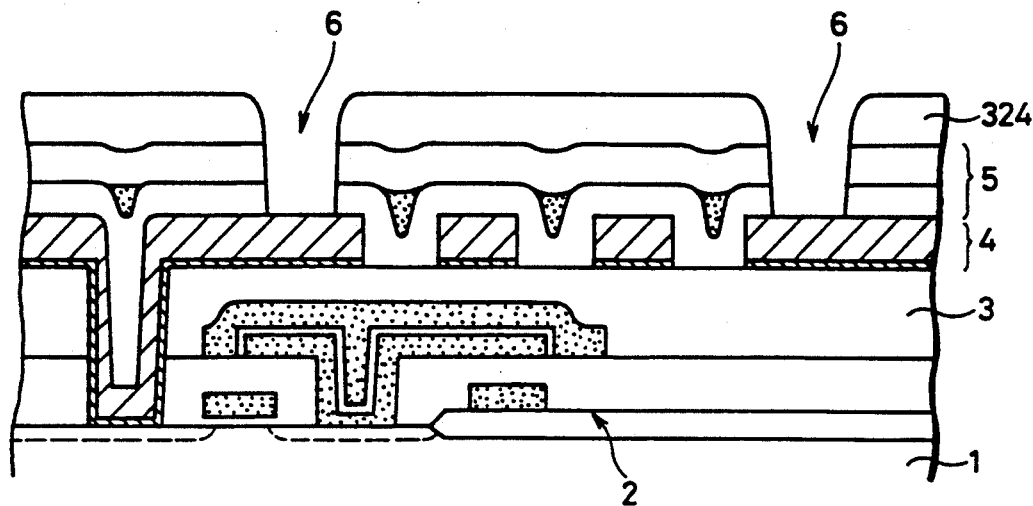
Figure 2E:
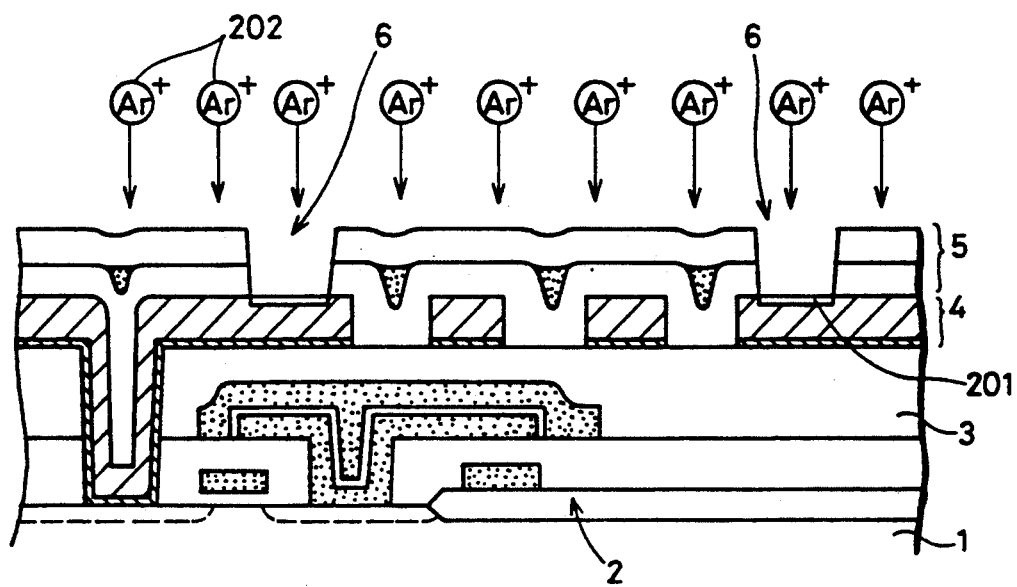
Figure 2F:
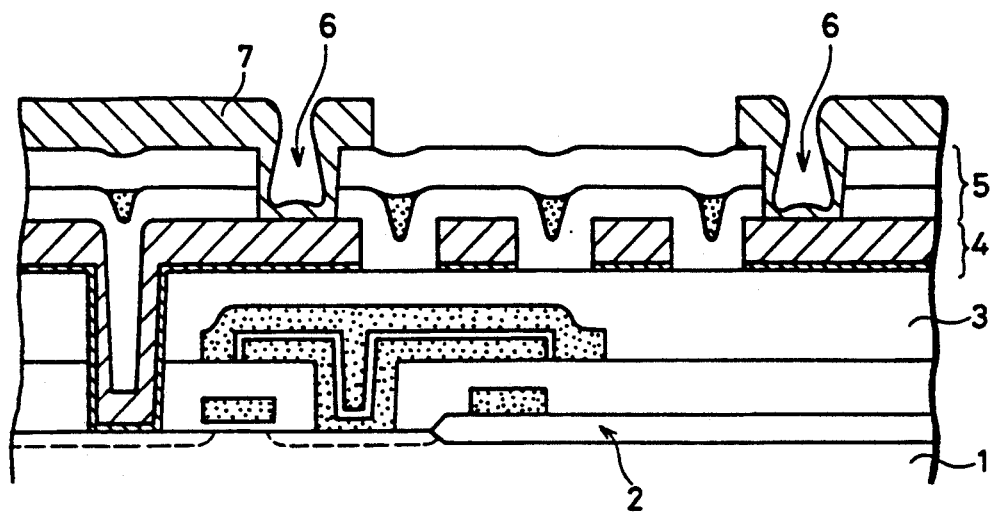
Figure 2G:
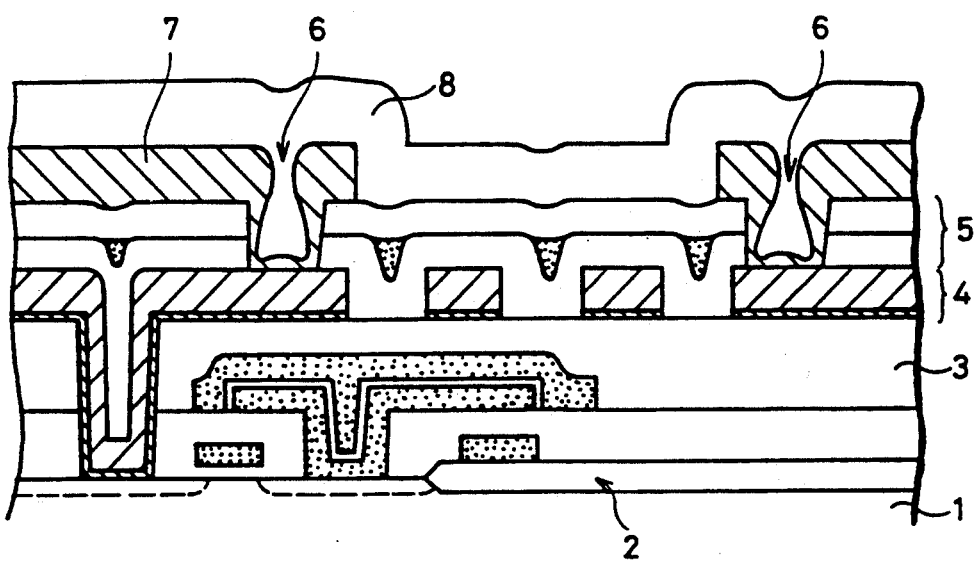
Figure 5A:
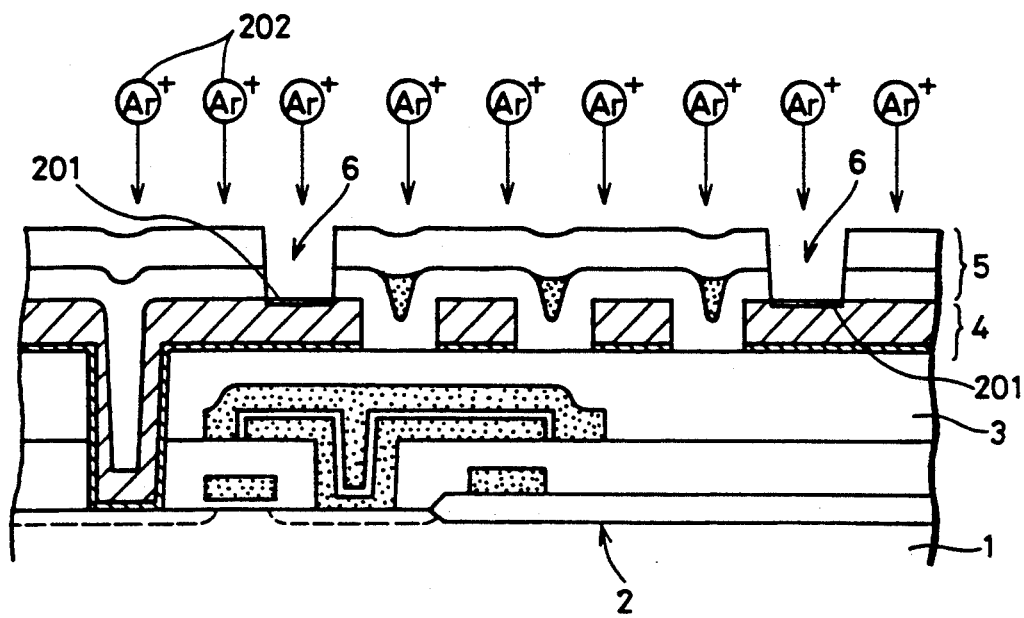
FIGS. 5A, 5B, 5C, 5D, 5E, 5F, 5G, 5H, 5I, and 5J are cross sectional views illustrating, sequentially, a manufacturing process of a semiconductor device having a multilayer interconnection structure according to the embodiment illustrated in FIG. 4.
Figure 5B:
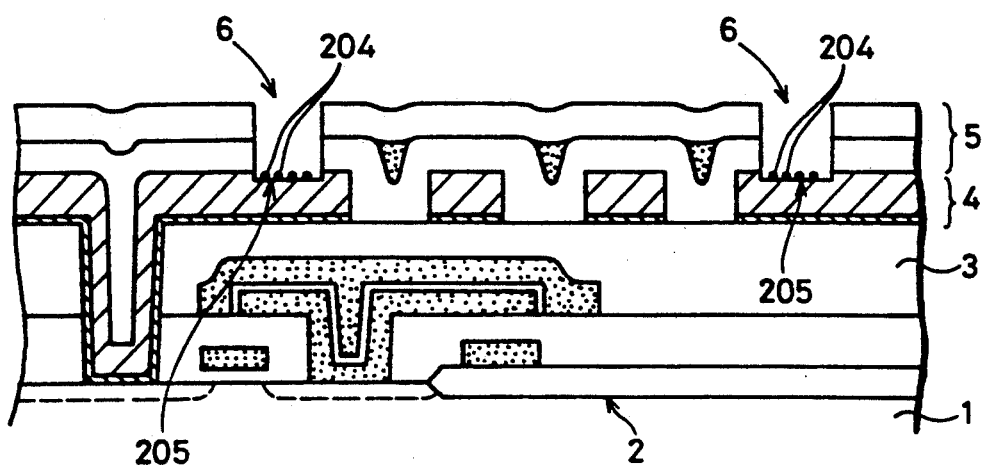

First, an interlayer insulating film 5 is provided, and a contact hole 6 is formed as illustrated in FIG. 2D as in the case of prior art, and sputter etching is carried out using Ar ions for removing an altered layer of aluminum 201 and for obtaining stable contact hole resistance (FIG. 5A).

However, if only sputter etching using Ar ions 202 is carried out in the case of contact hole 6 of a submicron level in which the aspect ratio exceeds 1, re-attachment of particles of fluoride or oxide of aluminum sputtered by Ar ions occurs as described above, so that there are a little remaining particles 204 on the outermost surface (interface) 205 of first aluminum interconnection 4 in contact hole 6 as described above (FIG. 5B).

Figure 5C:
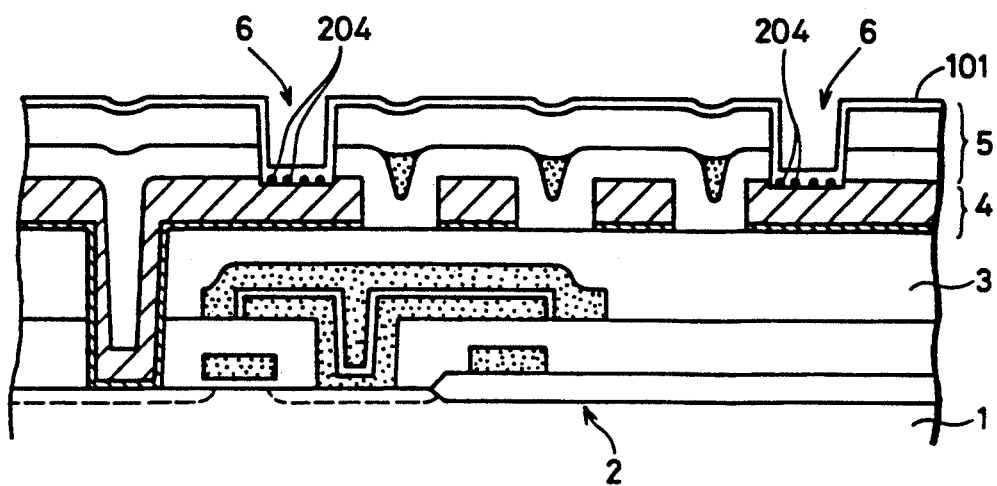

Therefore, a first titanium film 101 having a thickness in the range of about 50Å to about 150Å is deposited successively on the whole surface in a vacuum by a sputtering process for decomposing remaining particles 204 by a function described later and forming an intermetal compound by reacting with lower layer of aluminum interconnection 4 (FIG. 5C).

Figure 5D:
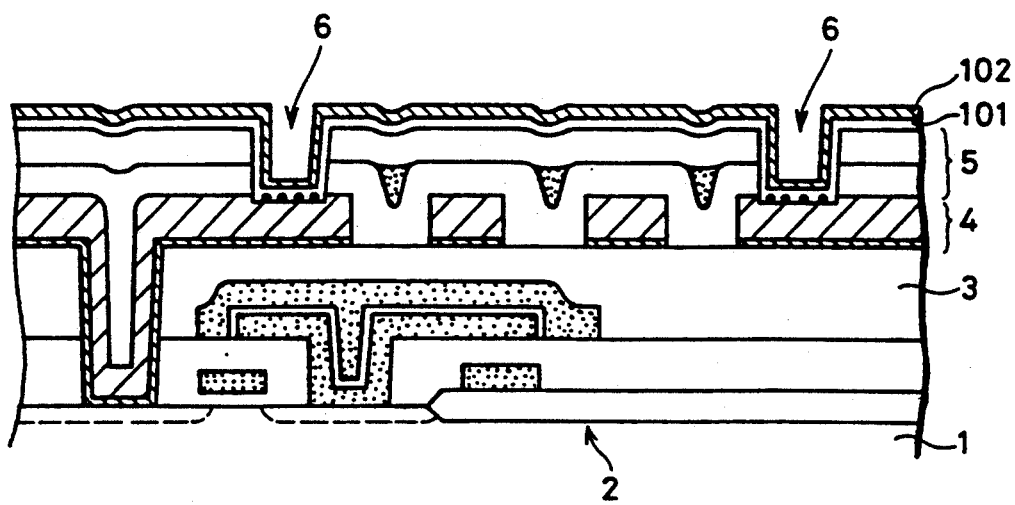

Then, a first titanium nitride film 102 having a thickness in the range of about 500Å to about 1000Å is deposited on first titanium film 101 (FIG. 5D). A reactive sputtering process in which sputtering is carried out in Ar+N$_2$ atmosphere using a Ti target is generally used as the method of deposition.

First titanium nitride film 102 has a function of inhibiting first titanium film 101 which is in contact with first aluminum interconnection 4 from reacting with a tungsten plug 103, which will be described later, earlier in heat treatment described later in contact hole 6.

Figure 5E:
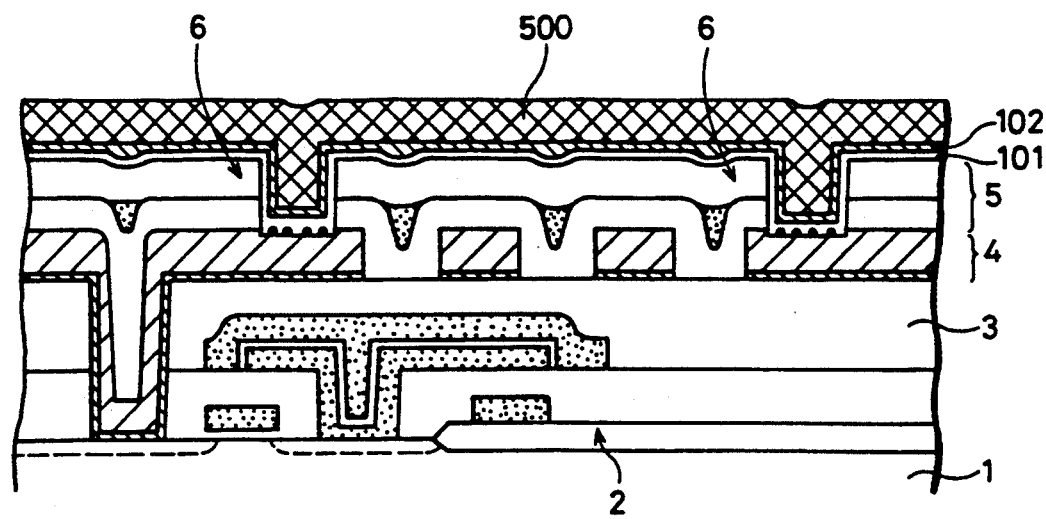

Then, a tungsten film 500 is formed on the whole surface of the wafer by a chemical vapor deposition process (hereinafter referred to as a CVD process) in an atmosphere at a temperature in the range of 300° C.–500° C. (FIG. 5E). A representative formation process of a tungsten film using a CVD process will be expressed by a chemical formula in the following.

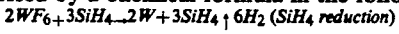

$2WF_6+3SiH_4\rightarrow 2W+3SiH_4 \uparrow 6H_2$ (SiH$_4$ reduction)

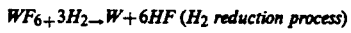

$WF_6+3H_2\rightarrow W+6HF$ (H$_2$ reduction process)

The method of forming a tungsten film by a CVD process is characterized by extremely good step coverage as compared to a sputtering process. Therefore, contact hole 6 having a small diameter and a large aspect ratio is buried completely by the tungsten film.

Figure 5F:
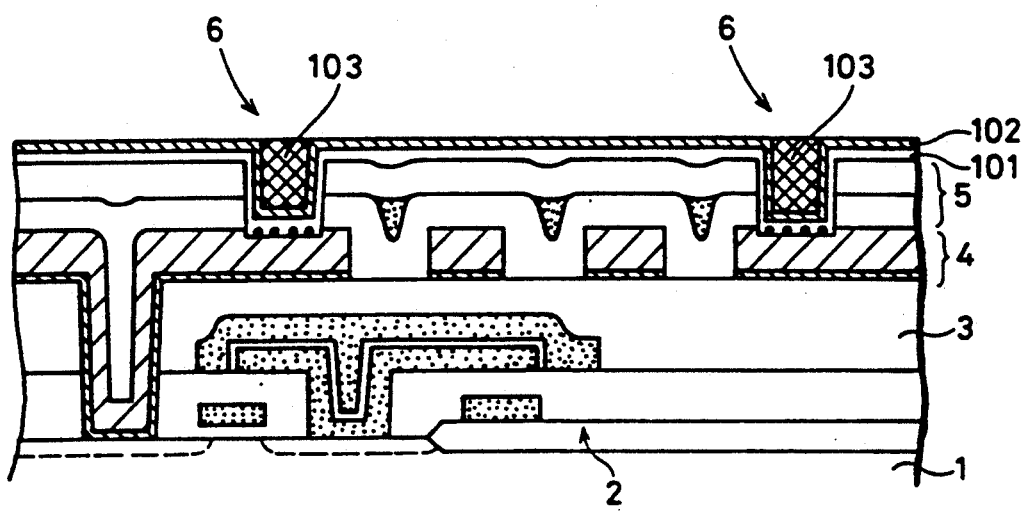

Then, the whole surface of tungsten film 500 formed by a CVD process is etched back using SF or the like to remove the tungsten film, leaving a tungsten plug 103 buried inside contact hole 6 (FIG. 5F).

Figure 5G:
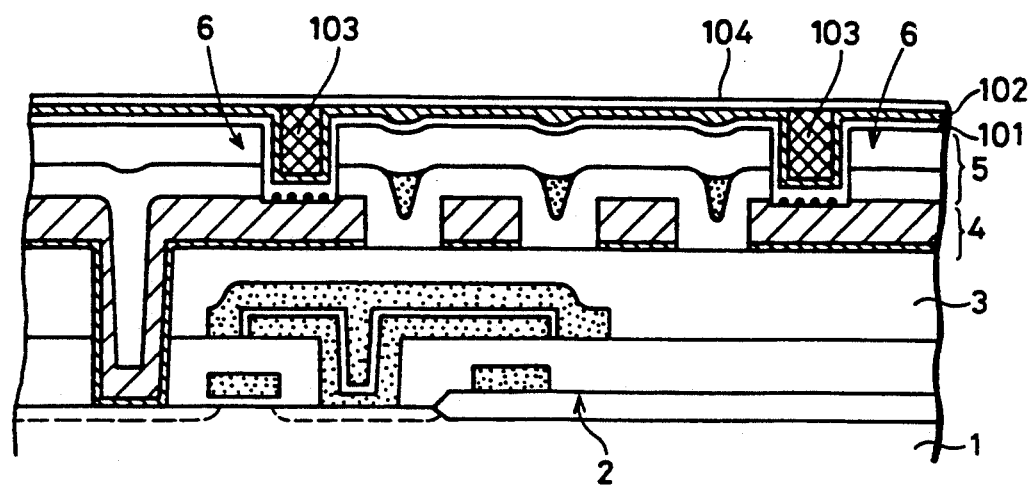

Then, again, a second layer of titanium film 104 having a thickness in the range of about 50Å to about 150Å is deposited over the whole surface by a sputtering process (FIG. 5G). Second layer of titanium film 104 serves to prevent fluorine, which might remain on tungsten plug 103, from reacting with second aluminum interconnection described later in heat treatment described later and contributes to preventing increase in the contact hole resistance in the contact between first aluminum interconnection 4 and second aluminum interconnection 100 and also to preventing open failure.

Figure 5H:
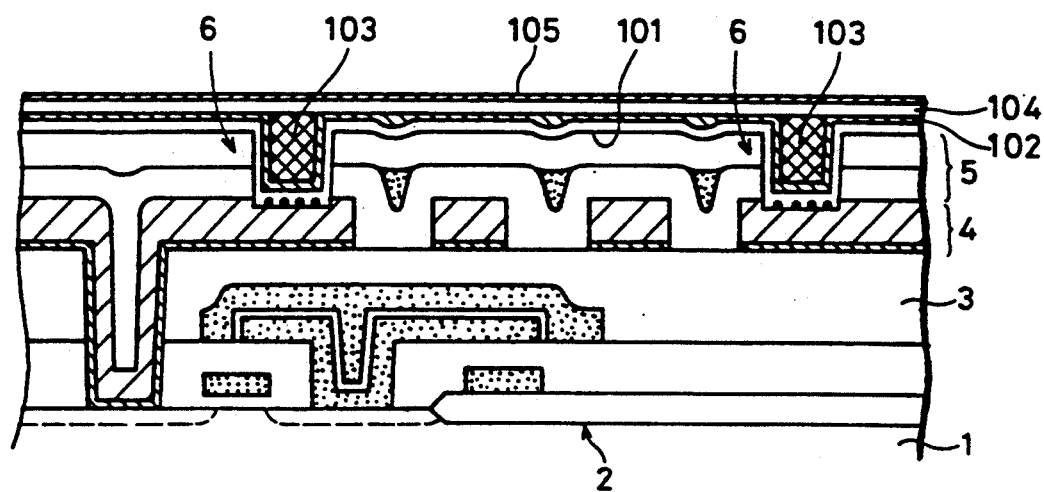

Then, a second titanium nitride film 105 having a thickness in the range of about 500Å- about 1000Å is deposited on second titanium film 104 (FIG. 5H). The method of deposition is the same as the one used in the case of first layer of titanium nitride film 102.

Second titanium nitride film 105 also has a function of inhibiting second aluminum interconnection 106 and second titanium film 104 from reacting with each other in contact hole 6.

Then, an Al-Si-Cu film, for example, is deposited successively by a sputtering process to be second aluminum interconnection 106, and conductive interconnection 100 having a five-layer structure including a first titanium film 101, a first titanium nitride film 102, a second titanium film 104, a second titanium nitride film 105, and second aluminum interconnection 106 is patterned into a desired interconnection pattern by a photolithography process or an etching process as in the case of first aluminum interconnection 4.

Figure 5I:
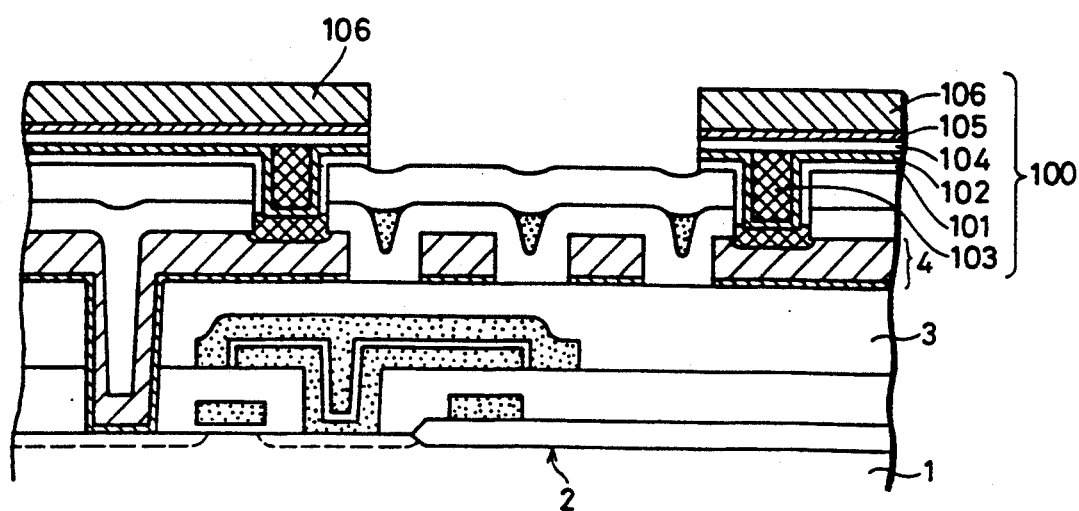

Then, heat treatment is carried out at a temperature in the range of 300° C.–450° C. for approximately 15 -approximately 60 minutes to decompose remaining particles 204 at interface 205 of first aluminum interconnection 4 in contact hole 6 by functions of first titanium film 101 and to make first aluminum interconnection 4 react with first titanium film 101 to form an intermetallic compound layer TiAl$_3$ 206 and accelerate mixing at the interface of the first aluminum interconnection 4 and second aluminum interconnection 100. Second titanium film 104 removes fluorine which might be generated on tungsten plug 103 (FIG. 5I).

Figure 5J:
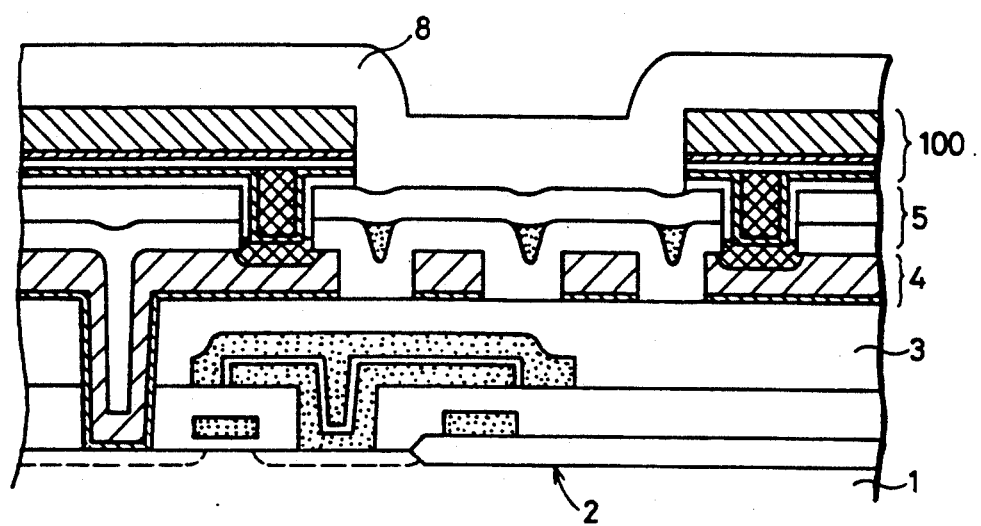

Finally, a protective insulating film 8 of a silicon oxide film, a silicon nitride film or the like is deposited on second aluminum interconnection 106 by a CVD process for protecting the semiconductor elements and interconnection from moisture or the like invading from the outside (FIG. 5J).

Figure 6A:
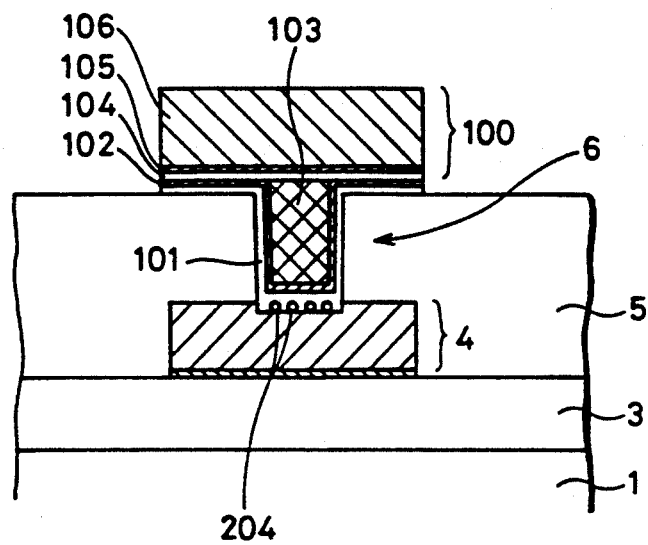
FIGS. 6A and 6B are cross sectional views illustrating enlarged views of the vicinity of contact hole 6 for explaining effects of heat treatment carried out after patterning from first titanium film 101 through second aluminum interconnection 106 into a desired interconnection pattern.
Figure 6B:
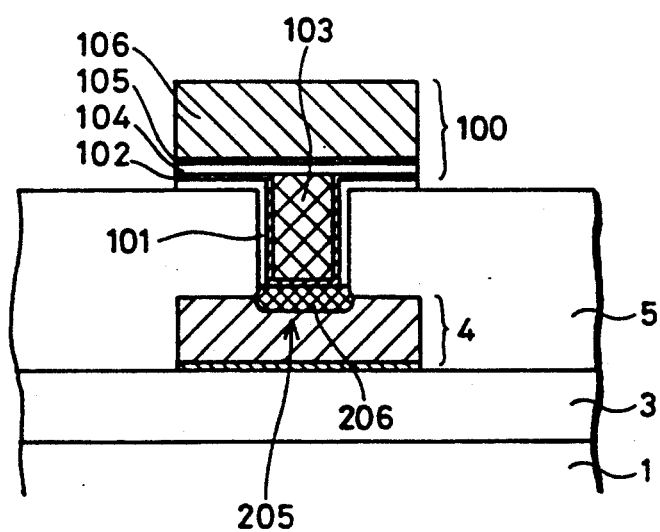

Now, effects of heat treatment after the above-described patterning will be described with reference to FIGS. 6A, 6B.

First titanium film 101 has strong bonding strength for bonding with fluorine or oxygen included in alterated layer of aluminum 201 (see FIG. 5A) and forms fluoride or oxide of titanium easily by heat treatment at a temperature in the range of 300° C.–450° C. Therefore, if heat treatment is carried out under the above-described conditions, it takes in remaining particles 204 under first titanium film 101 as illustrated in FIG. 6A as oxide or fluoride of titanium and decomposes them. Furthermore, as illustrated in FIG. 6B, if first aluminum interconnection 4 and first titanium film 101 are made to react with each other by heat treatment to form an intermetallic compound TiAl$_3$ layer 206, it has a function of accelerating mixing at interface 205. Fluorine on tungsten plug 103 is also removed by second titanium film 104 in the same way.

There is an optimum value of the thickness of first titanium film 101 as described in the following.

Figure 7:
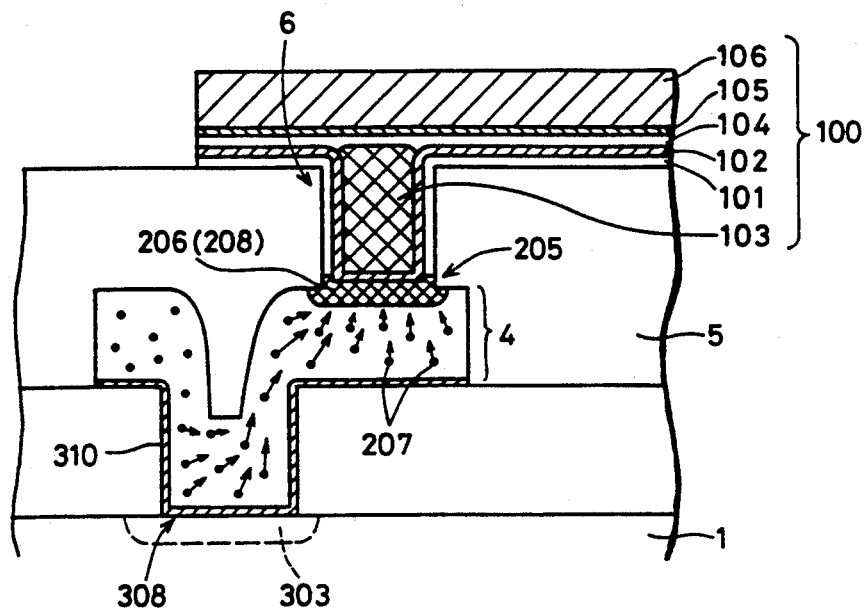
FIG. 7 is a cross sectional view showing an enlarged view of the vicinity of contact hole 6 for explaining functions of silicon 207 with which first aluminum interconnection 4 is doped.

As illustrated in FIG. 7, first aluminum interconnection 4 is normally doped with silicon 207 of approximately 1wt.% to approximately 2wt.%. It is doped for preventing junction leakage in a part 308 of contact with silicon semiconductor substrate 1, since its function as a barrier against silicon or aluminum is not complete even if a titanium nitride film having high resistivity in the range of about 400μΩ.cm–about 2000μΩ.cm is used as a barrier metal film 310 of first aluminum interconnection 4.

If the above-described heat treatment is carried out then, first titanium film 101 reacts with first aluminum interconnection 4 to form intermetallic compound layer 206 of TiAl$_3$ or the like as described above, and also first titanium film 101 reacts with silicon 207 to form TiSi$_2$ 208.

Therefore, if the thickness of first titanium film 101 is too large, the concentration of silicon 207 in first aluminum interconnection 4 is caused to be lowered, and junction leakage is generated in contact part 308.

Figure 3A:
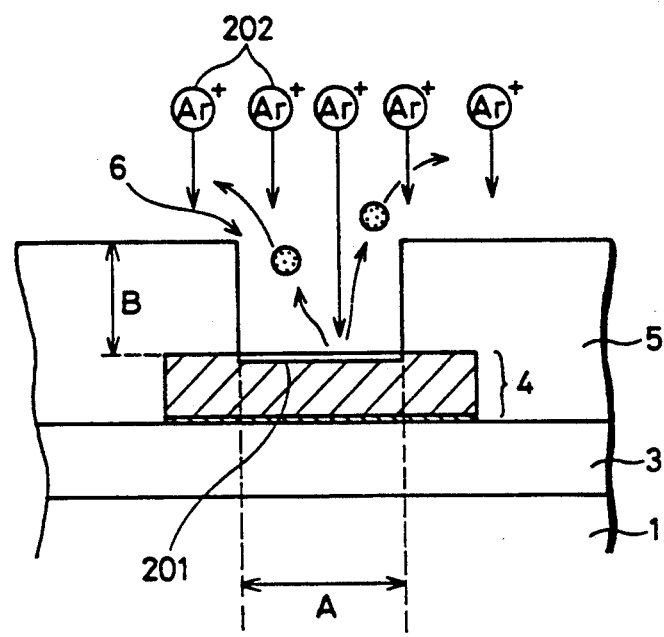
FIGS. 3A and 3B are cross sectional views for explaining problem occurring during sputter etching by argon ions in the case where the aspect ratio of contact hole 6 is 1 or more, comparing the case where the aspect ratio is 1 or less (FIG. 3A) and the case where the aspect ratio is 1 or more (FIG. 3B)
Figure 3B:
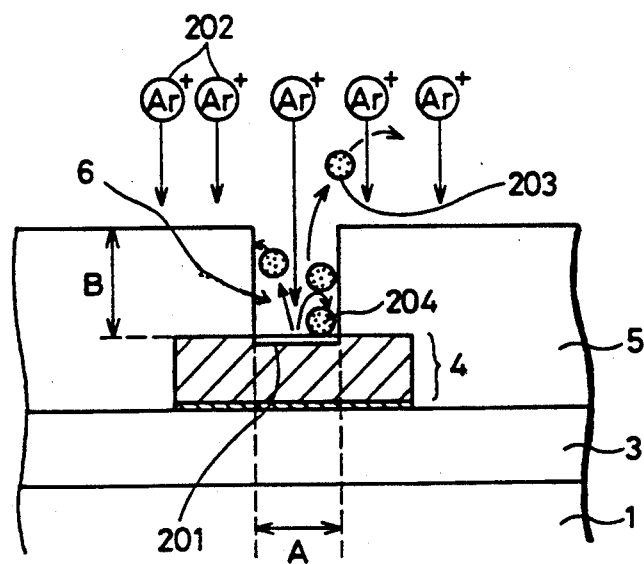
Figure 3C:
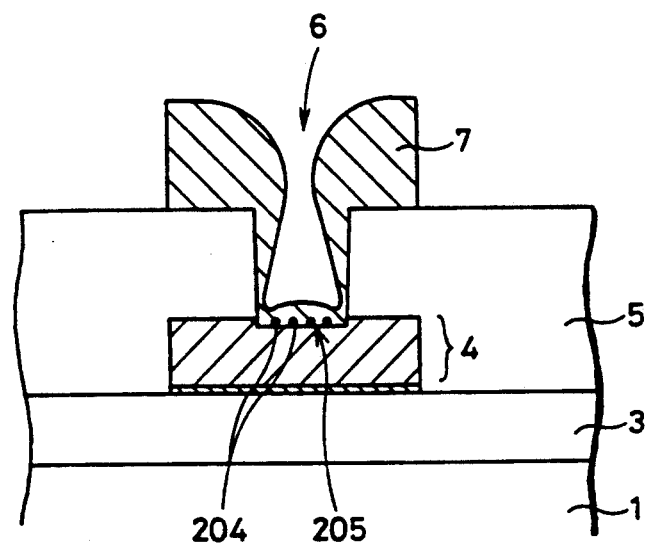
FIG. 3C is a cross sectional view illustrating an aspect that there are remaining particles 204 on the bottom surface of contact hole 6 in the case where the aspect ratio of contact hole 6 is 1 or more.

On the other hand, if the thickness of first titanium film 101 is too small, the function of decomposing remaining particles 204 at interface 205 and forming intermetallic compound TiAl$_3$ layer 206 at interface 205 to accelerate mixing as illustrated in FIG. 3A becomes insufficient.

For these reasons, is it found out that there are an upper limit and a lower limit of the thickness of first titanium film 101, and, according to experiments, a desirable thickness is in the range of about 50Å –about 150Å.

Now, functions of first titanium nitride film 102 will be described. If there is no first titanium nitride film 102, first titanium film 101 reacts with the upper layer of tungsten plug 103 before reacting with first aluminum interconnection 4. Therefore, first titanium film 101 does not function to decompose remaining particles 204 sufficiently at interface 205 or to react with the lower layer of aluminum interconnection 4 to form an intermetallic compound.

On the other hand, if first titanium nitride film 102 having small reactivity for reacting with tungsten is provided on first titanium film 101, first titanium film 101 is inhibited from reacting with tungsten plug 103, so that it is possible to decompose remaining particles 204 and to carry out mixing of interface 205 sufficiently by heat treatment for forming tungsten plug 103.

Accordingly, it is preferable that the reactivity of first titanium nitride film 102 for reacting with tungsten plug 103 is small, so that a titanium nitride film having small resistivity in the range of about 250μΩ.cm to about 400μΩ.cm is used to inhibit the increase in the contact hole resistance as much as possible. Conditions of formation of a film for obtaining a film having such resistivity reduce foreign materials attaching during formation of a film.

Generally, it is necessary for titanium nitride film 310, which is used as a barrier metal film in the contact part with the Si substrate, to have a function of a barrier against silicon and aluminum, so that a film having high resistivity in the range of about 400μΩ.cm to about 2000μΩ.cm is used. However, if such a film is used in contact hole 6, the contact hole resistance becomes several times as high as the contact hole resistance in the conventional structure. As described above, first titanium nitride film 102 is used in contact hole 6 for the purpose of inhibiting first titanium film 101 from reacting with tungsten plug 103, and its function as a barrier against aluminum is not so necessary. Therefore, it is possible to use a film having small resistivity in the range of about 250μΩ.cm to about 400μΩ.cm and, as a result, to keep increase in the contact hole resistance 50% or less, which is a level offering no problem in practice. For the same reason, a film having small resistivity in the range of about 250μΩ.cm to about 400μΩ.cm is also used as second titanium nitride film 104.

It is also desirable that the thickness of first titanium nitride film 102 is in the range of about 500Å–about 1000Å for the purpose of inhibiting first titanium film 101 from reacting with tungsten plug 103 and also for the purpose of keeping increase in the contact hole resistance being of a level offering no problem in practice. It is also desirable that the thickness of second titanium nitride film 105 is in the range of about 500Å— about 1000Å for the purpose of inhibiting second titanium film 104 from reacting with second aluminum interconnection 106 in the upper part and also for the purpose of keeping increase in the contact hole resistance being of a level offering no problem in practice.

While description was given of a case where second titanium nitride film 105 is provided on second titanium film 104 to inhibit second titanium film 104 from reacting with aluminum alloy film 106 in second aluminum interconnection 100 in the above embodiment, the same effects are achieved if it is another titanium compound film such as a titanium oxide film or a titanium oxynitride film or the like which has the same function of inhibiting second titanium film 104 from reacting with aluminum alloy film 106 in second aluminum interconnection 100.

Those films can be deposited by a reactive sputtering process as in the case of the embodiment. Specifically, the film can be deposited by sputtering using Ti as a target in Ar+O$_2$ atmosphere in the case where a titanium oxide film is deposited and in Ar+O$_2$+N$_2$ atmosphere in the case where a titanium oxy-nitride film is deposited.

While description was given of a case where a tungsten plug is formed by a CVD process to improve coverage of aluminum in the contact hole, the same effects are achieved by another metal CVD process using tungsten silicide, molybdenum, aluminum or the like.

While an aluminum two-layer interconnection structure was described in the above-described embodiment, the same effects are achieved if an aluminum multilayer interconnection structure of three layers or more is applied to a semiconductor device.

While a case where the present invention is applied to a semiconductor device having a DRAM element formed on the surface of a semiconductor substrate was described in the above embodiment, the same effects can be achieved if it is applied to another semiconductor device having an aluminum multilayer interconnection structure.

Figure 8:
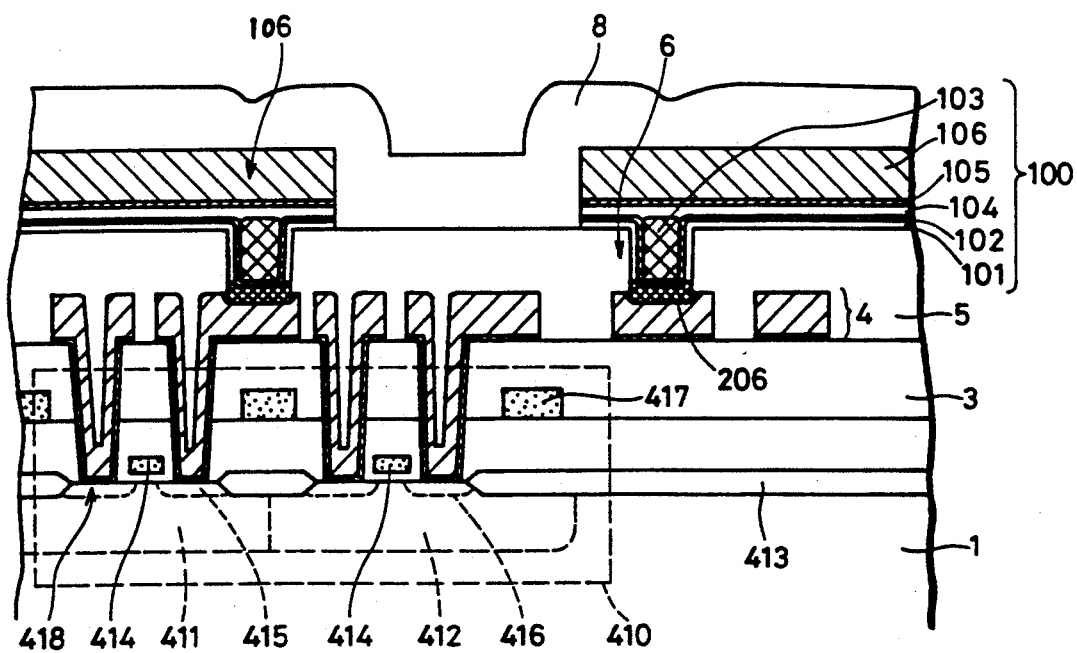
FIG. 8 is a cross sectional view illustrating a structure in which the present invention is applied to a SRAM.

For example, an embodiment in which an aluminum multilayer interconnection structure according to the present invention is applied to a semiconductor device having a SRAM (Static Random Access Memory) element formed on the surface of a semiconductor substrate is illustrated in FIG. 8.

A semiconductor device of the embodiment illustrated in FIG. 8 has a SRAM element (double-well CMOS (Complementary Metal Oxide Semiconductor) structure) 410 formed on the surface of a silicon semiconductor substrate 1. The SRAM element includes a p-type well region 411, an n-type well region 412, an element isolating oxide film 413, a gate electrode 414, an n-type impurity diffused layer 415, a p-type impurity diffused layer 416, polycrystalline silicon interconnection 417, and a contact hole 418. An insulating film 3 is deposited on SRAM element 410, and first aluminum interconnection 4 is formed on insulating film 3. An interlayer insulating film 5 is deposited on first aluminum interconnection 4, and a contact hole 6 is opened in interlayer insulating film 5 on first aluminum interconnection 4. A first titanium film 101 is formed on interlayer insulating film 5 to be in contact with first aluminum interconnection 4, and a first titanium nitride film 102 is deposited thereon. A tungsten plug 103 is buried in contact hole 6 to be on first titanium nitride film 102. A second titanium film 104 is deposited over tungsten plug 103 and over first titanium nitride film 102, and a second titanium nitride film 105 is further deposited thereon. Second aluminum interconnection 106 of an aluminum film or an aluminum alloy film is formed on second titanium nitride film 105. A protective insulating film 8 is deposited over second aluminum interconnection 106 and over exposed interlayer insulating film 5 for protecting them from external environment. An intermetallic compound (TiAl$_3$) layer 206 is formed by reaction at the interface between first titanium film 101 and first aluminum interconnection 4.

The element formed on the surface of silicon semiconductor substrate 1 may be an element other than a DRAM element and a SRAM element which has another structure, for example, an EPROM (Erasable Programmable Read Only Memory) element, an EEPROM (Electrical Erasable Programmable ROM) element, a microcomputer circuit element, a CMOS logic circuit element, a bipolar transistor element or the like.

As described above, according to the semiconductor devices in the above respective embodiments, first titanium film 101 takes in the particles of fluoride or oxide of aluminum re-attaching during sputter etching as fluoride or oxide of titanium and decomposes them and forms an intermetallic compound TiAl$_3$ between first aluminum interconnection 4 and itself to make the interface react sufficiently to carry out mixing, and first titanium compound film 102 supports it. In addition, tungsten plug 103 fills in contact hole 6, so that coverage of second aluminum interconnection 106 formed thereon is improved. Second titanium film 104 removes fluorine, which might be generated during formation of tungsten plug 103, in the same way as in the case of first titanium film 101, and second titanium compound film 102 supports it, so that the contact hole resistance becomes stable even in the case of contact hole 6 of a submicron level, and it is possible to enhance the reliability level of contact hole 6 such as resistance to elecromigration, resistance to stress migration or the like and to obtain a semiconductor device of a high quality with a high yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a multilayer interconnection structure, comprising:
   first aluminum interconnection;
   an interlayer insulating film covering said first aluminum interconnection and having a contact hole whose bottom surface is the surface of said first aluminum interconnection;
   a first titanium film formed on said interlayer insulating film and on the inner surface of said contact hole;
   a first titanium compound film formed on said first titanium film;
   a tungsten plug buried in said contact hole with said first titanium film and said first titanium compound film interposed therebetween;
   a second titanium film formed on said tungsten plug and on said first titanium compound film;
   a second titanium compound film formed on said second titanium film; and second aluminum interconnection formed on said second titanium compound film.

2. The semiconductor device having a multilayer interconnection structure according to claim 1, wherein said first titanium compound film includes titanium nitride.

3. The semiconductor device having a multilayer interconnection structure according to claim 1, wherein said second titanium compound film includes titanium nitride.

4. The semiconductor device having a multilayer interconnection structure according to claim 1, wherein the thickness of said first titanium film and the thickness of said second titanium film are respectively in the range of 50Å–150Å.

5. The semiconductor device having a multilayer interconnection structure according to claim 1, wherein the thickness of said first titanium compound film and the thickness of said second titanium compound film are respectively in the range of 500Å–1000Å.

* * * * *